United States Patent
Shi et al.

(10) Patent No.: US 8,136,023 B2
(45) Date of Patent: Mar. 13, 2012

(54) DECODING METHOD FOR TAIL-BITING CONVOLUTIONAL CODES USING A SEARCH DEPTH VITERBI ALGORITHM

(75) Inventors: Wuxian Shi, Beijing (CN); Juan Du, Beijing (CN); Yiqun Ge, Beijing (CN); Guobin Sun, Beijing (CN)

(73) Assignee: STMicroelectronics (Beijing) R&D Company Ltd., Beijing (CN)

( * ) Notice: Subject to any disclaimer, the term of this patent is extended or adjusted under 35 U.S.C. 154(b) by 0 days.

(21) Appl. No.: 12/945,661

(22) Filed: Nov. 12, 2010

(65) Prior Publication Data
US 2011/0060972 A1 Mar. 10, 2011

Related U.S. Application Data

(63) Continuation of application No. 11/687,543, filed on Mar. 16, 2007, now Pat. No. 7,856,591.

(30) Foreign Application Priority Data

Mar. 31, 2006 (CN) .......................... 2006 1 0084044

(51) Int. Cl.
*H03M 13/03* (2006.01)
(52) U.S. Cl. .................... 714/795; 375/341; 375/346
(58) Field of Classification Search .................. 714/795; 375/341, 346
See application file for complete search history.

(56) References Cited

U.S. PATENT DOCUMENTS

| | | | |
|---|---|---|---|
| 5,349,589 A | 9/1994 | Chennakeshu et al. | |
| 5,355,376 A | 10/1994 | Cox et al. | |
| 6,088,405 A * | 7/2000 | Hladik et al. | 375/341 |
| 6,256,764 B1 | 7/2001 | Atallah | |
| 6,484,285 B1 * | 11/2002 | Dent | 714/791 |
| 6,877,132 B1 * | 4/2005 | De et al. | 714/795 |
| 7,116,734 B1 | 10/2006 | Nergis | |
| 2002/0150180 A1 | 10/2002 | Malmberg et al. | |

OTHER PUBLICATIONS

Ma, Howard H., Wolf, Jack K., On Tail Biting Convolutional Codes, IEEE Transactions on Communications, vol. COM-34, No. 2, Feb. 1986, pp. 104-111.

Wang, Qiang, Bhargava, Vijay K., An Efficient Maximum Likelihood Decoding Algorithm for Generalized Tail Biting Convolutional Codes Including Quasicyclic Codes, IEEE Transactions on Communications, vol. 37, No. 8, Aug. 1989, pp. 875-879.

Cox, Richard V., Sundberg, Carl-Erik W., An Efficient Adaptive Circular Viterbi Algorithm for Decoding Generalized Tailbiting Convolutional Codes, IEEE Transactions on Vehicular Technology, vol. 43, No. 1, Feb. 1994, pp. 57-68.

(Continued)

*Primary Examiner* — Sam Rizk
(74) *Attorney, Agent, or Firm* — HoganLovells US LLP

(57) ABSTRACT

A method for decoding tail-biting convolutional codes. The method includes initializing a correction depth, selecting a first starting state from a set of encoding states, and initializing a metric value for the selected starting state as zero and the other states as infinity. The input bit stream is read and a Search Depth Viterbi algorithm (SDVA) is performed to determine path metrics and identify a minimum-metric path. The ending state for the minimum-metric path is determined and the output for this ending state is identified as "previous output." A second starting state is set to the ending state of the minimum-metric path, and symbols equal to the correction depth from the previous output are read. The SDVA is performed on the second set of read symbols to generate a corrected output. A decoded output is generated by replacing symbols at the beginning of the previous output with the corrected output.

20 Claims, 14 Drawing Sheets

OTHER PUBLICATIONS

International Search report for Application No. 07251368.2-2415 / 1841116, mailed May 28, 2009, pp. 17.

Anderson, John B. et al., "An Optimal Circular Viterbi Decoder for the Bounded Distance Criterion", IEEE Transactions on Communications, Piscataway, NJ, vol. 50, No. 11, Nov. 11, 2002, pp. 1736-1742.

Schlegel, Christian B. et al., "Trellis and Turbo Coding", Wiley Interscience, John Wiley & Sons, Inc., XP002526652, 2004, pp. 200-203.

* cited by examiner

DECODING METHOD FOR TAIL-BITING CONVOLUTIONAL CODES USING A SEARCH DEPTH VITERBI ALGORITHM

RELATED APPLICATION

This application claims the priority benefit of Chinese application Serial No. 200610084044.2 filed Mar. 31, 2006 and is a continuation of U.S. patent application Ser. No. 11/687,543 filed on March 16, 2007. The disclosure of the foregoing United States Patent Application is specifically incorporated herein by this reference.

BACKGROUND OF THE INVENTION

1. Field of the Invention

The present invention relates, in general, to error correction in communication systems such as errors produced in channels in wireless or digital radio communications between devices, and, more particularly, to software, systems, and methods for decoding tail-biting convolutional codes at a receiver, such as an uplink receiver for an orthogonal frequency division multiplexing access (OFDMA) communication system or network.

2. Relevant Background

There are ongoing efforts to provide next generation mobile communications and to improve existing communications among networked devices including among wireless devices. A recent development has been to not only do away with wires or cables within a building or home but also to do away with the cables coming into the building or home. WiMAX technology (also known as 802.16 because it is based on the IEEE 802.16 WirelessMAN Standard for Wireless Metropolitan Area Networks) promises to allow this jump to more wireless communications that function as a wireless alternative to cable modems and DSL (Digital Subscriber Line). WiMAX will likely offer connectivity at up to 30 miles from an antenna at speeds up to 75 mbps (megabytes per second) and at higher rates or speeds under 5 miles, whereas a cable modem may only offer speeds of 1 mbps. As a result, where cable and telephone companies do not offer broadband Internet connections, WiMAX technology offers a way to provide broadband Internet, digital TV, and other digital communications with the use of a wireless antenna to pick up a WiMAX signal that is then distributed wireless (or with wires) throughout the local area by a base station (BS) to user terminals or devices (e.g., to subscriber stations (SSs)). The OFDM (Orthogonal Frequency Division Multiplexing) technique has been widely proposed in WiMAX and many other wireless systems to provide high data rate transmission. OFDM uses a set of overlapping but orthogonal sub-carriers to realize high spectrum efficiency. More recently, combined with TDMA (Time Division Multiple Access) and/or FDMA (Frequency Division Multiple Access), OFDMA has been proposed in many broadband wireless systems such as WiMAX systems.

An ongoing challenge in any communication system, including WiMAX systems such as those defined by IEEE 802.16d/e, is how to correct errors in the signal between a transmitting device and a receiving device. Information signals or data transmitted between a transmitter and a receiver via a communication channel can be corrupted, i.e., errors can be introduced into the signal or data before it is received at the receiver. A communication channel is any medium (wired or wireless) between a transmitter and a receiver. The medium may introduce noise, interference, or other channel errors, and any medium that may inject errors can be thought of as a channel. The medium may be a storage medium or a communication or data transfer medium. In a practical radio communication system, noise is also picked up by the antenna or is generated within the front end amplifiers of the receiver. So, effective methods must be taken to correct errors generated by adding all these kinds of noise on a received signal.

Error detection and error correction codes are widely employed in digital communication systems to ensure the transmission reliability, and such codes are typically provided by channel encoding and decoding, i.e., an encoder in the transmitting device and a decoder in the receiving device. The use of such error correction acts to assist in protecting against channel errors, which occur in situations such as where there is noise, fading, multipath and interference such as when signal transmission or reception is in an elevator, in a moving car, amidst tall buildings, in hilly terrain, or the like. By adding redundancy or redundant bits into the transmitted information bits, error control techniques enable receivers to detect or even correct the errors introduced by channel distortion. While it is useful to add redundant bits to facilitate error correction, transmission of the redundant bits also consumes additional bandwidth and their number should be limited where possible to limit bandwidth usage.

One well-known technique for error-correction is by encoding the transmitted signal or data using convolutional codes (CC). Convolutional codes are generally described by a coding rate, a constraint length, and generator polynomials. In a convolutional encoder, each input bit travels through each memory element such that the number of output bits generated by the encoder corresponds to the number of input bits and the coding rate of the convolutional encoder. One method of convolutional encoding is to use "tail bits" to flush the encoder by initializing each memory element with a zero (e.g., to force a reset to the zero state) and the tail bits are added at the end of the input frame or stream as tails, which caused the increase of frame or stream length. FIG. 1 illustrates an example of a tail bits convolutional codes encoder 100 that receives an input stream of bits 102, has two memory elements 104, 106, two adder circuits 108, 110, and produces two output bits 120. The encoder 100 has a coding rate of 1/2 and a constraint length of 3, and as shown at this rate, one bit input 102 produces two bits output 120. It should be pointed out that the actual output bit 120 is not only related to the actual input 102 but also is related to the previous inputs from memory of the encoder or transmitter embodying the encoder 100. As a tail bits convolutional codes encoder 100, its shift registers shall be initialized by a definitive code (in most cases, an all-zero code), and this code is appended to the end of the information block to be encoded, which ensures that the encoder has the same starting state and ending state.

A well-known decoding technique performed at a receiver for convolutional codes is the Viterbi algorithm (VA) based on a trellis. FIG. 2 shows a trellis structure 200 of tail bits convolutional codes, i.e., for the encoder structure 100 in FIG. 1. The two shift registers 104, 106 of the encoder 100 will generate four different states at one stage in the trellis 200. The nodes in each column stand for the different states at each stage. The solid lines represent the state transition if the input bit is 0; while the dotted lines represent the state transition if the input bit is 1. The two values in the parentheses above these lines are the corresponding outputs. The fundamental idea of the VA is to obtain the minimum distance (or path metric) path from a starting state to an ending state. The distance is calculated between the decoding input and the output in the corresponding location of the trellis and stored in decoder memory (or receiver memory) as a branch metric. An Add-Compare-Select (ACS) process is taken to select a survival path. The branch metric accumulated along a survival path is denoted as a path metric. For each state at one stage, there will be only one survival path and one relevant path metric value. For instance for the encoder shown in FIG. 1, since both the starting state and ending state are "00", the survival path must begin and end at the state "00". At the end of the last stage, the VA starts from the state "00" and traces back to the state "00" at the first stage to retrieve the final decoding outputs.

An ACS process 300 for the VA is detailed in FIG. 3. The value above the state is designated for the path metric; while the value above the transition branch is for the branch metric. Two branches merge into one state in the ACS process 300. On the assumption that the VA is determining the survival path on the state "00" at the k-th stage, it needs to compare the accumulated path metrics of the "up" branch and the "down" branch. For example, the up branch merging into the state "00" at the k-th stage derives from the state "00" of the (k−1)-th stage. The path metric value on the state "00" of the (k−1)-th stage is 0.22, and the branch metric of the transition between these two states is 0.11. Thus, the up path metric on the state "00" at the k-th stage is accumulated to 0.33 (i.e., 0.22+0.11). In the same way, the down path metric on the state "00" at the k-th stage is accumulated to 0.22 (i.e., 0.16+0.06). After comparing the up and down path metrics, the VA decides to take the down path, i.e. the smaller one, as the survival path and saves the value 0.22 as the path metric on the state "00" at the k-th stage. The same operations are taken on the other states at the k-th stage.

As mentioned above, the tail bits convolutional codes encoder has a priori knowledge of starting and ending state in trellis diagram, which makes the VA useful for easily and reliably decoding tail bits convolutional codes. However, the appended tails reduce the bit rate to some extent since the tail bits must also be passed through the encoder. In order to maintain a higher bit rate, tail-biting convolutional codes have been proposed for use in encoding to provide forward error correction in communication systems.

FIG. 4 illustrates an exemplary encoder 400 employing tail-biting convolutional codes with a coding rate of 1/2 and a constraint length of 3. The encoder 400 receives an input bit stream 402, includes a pair of memory elements or shift registers 404, 406 and a pair of adder circuits 408, 410, and outputs to output bits 420. Different from the previous tail bits CC encoder 100, its shift registers 404, 406 are initialized by the last 2 bits of the information 402 to be encoded. The encoder 400 still guarantees that the starting and ending states are the same in its trellis, but the decoder 400 has no knowledge of the starting and ending states before decoding, which makes the decoding process much more complex than that of signal or data stream received from a tail bits convolutional codes encoder.

FIG. 5 illustrates the trellis diagram structure 500 of tail-biting convolutional codes when the VA is used for decoding. The decoder of tail-biting convolutional codes is only aware that the starting state and the ending state will be the same. One possible decoding method is to try all the states as a tentative starting state on one-by-one basis. For each starting state, the decoder would find the path with minimum path metric at the last stage as a tentative survival path. After trying all the starting states, the tentative survival path with the same starting state and ending state would be regarded as the final survival path. However, such a decoding algorithm or technique would need to perform the VA from the first stage to the last stage for $2^{km}$ time (where "m" stands for number of input bit in one instant and "k" for the shift register size). As a result, such a decoding method is far too complex to satisfy a real-time system software implementation, such as in a digital signal processor (DSP) of a communication system receiver.

The communication industry continues, therefore, to demand a low-complexity tail-biting CC decoding algorithm with a sound error protection performance. This search for an improved decoding method, and decoders embodying such a decoding method, has more recently become even more important. This is because tail-biting convolutional codes have the advantage of saving bit rate without adding special tail bits to the encoded block. As a result, these encoding techniques have been adopted as standards for certain types of communication systems. For example, it has been used to encode the short message in North American Digital Cellular Radio (IS-54). Additionally, WiMAX systems are expected to become increasingly important in the wireless communication industry, and tail-biting convolutional codes have been adopted as a mandatory forward error correction scheme in the OFDMA mode of IEEE 802.16d/e systems.

Existing decoders have not satisfied all of the demands of the communication industry, e.g., the demands for lower computational complexity and for reduced memory usage by the decoder. For example, one proposed decoding method [R. V. Cox and C-E. W. Sundberg, "An Efficient Adaptive Circular Viterbi Algorithm for Decoding Generalized Tail-biting Convolutional Codes", IEEE Transactions on Vehicular Technology, Vol. 43, No. 1, pp. 57-68, February 1994] includes starting from all the states, saving the corresponding best-trellis-path, and decoding a metric score each time. The method then continues with comparing all the saved decoding-metric-scores to select the best one and then, giving out its corresponding output bit stream as the correct and most likely decoding result. However, such a decoding method is too complex for implementation in real-time communication applications and systems as it involves the standard Viterbi algorithm being performed $2^{mk}$ times.

Two other proposed decoding schemes, i.e., the "Bar-David" scheme and the "two-steps scheme," also fail to address the concerns of the communications industry [H. H. Ma and J. K. Wolf, "On Tail Biting Convolutional Codes", IEEE Transactions on Communications, Vol.COM-34, No. 2, pp. 104-111, February 1986; Q. Wang and V. K. Bhargava, "An Efficient Maximum Likelihood Decoding Algorithm for Generalized Tail Biting Convolutional Codes Including Quasicyclic Codes", IEEE Transactions on Communications., Vol. 37, No. 8, pp. 875-879, August 1989]. In the Bar-David decoding method, the processing steps include: (1) choosing an arbitrary starting state; (2) decoding using a maximum likelihood decoder which finds the best path from that starting state to all possible ending states; (3) checking the decoded code word to see if the starting state is the same as the ending state and if yes, stopping, otherwise going a next step; (4) using the previous ending state as the new starting state, checking to see if this starting state has been tried before, and if yes, going to step 1, otherwise returning to step 2. The Bar-David method has a number of disadvantages. The standard Viterbi algorithm needs to be performed at least twice, except that the first chosen starting state is just the real starting state. In non-optimum occasions, the Bar-David computational complexity is the same as that in other proposed methods (i.e., repeating the VA algorithm $2^{mk}$ times), and so, this method is still too complex for implementation and real-time application. In the proposed two-step method, the processing steps include: (1) obtaining an ordered list of the $2^{mk}$ starting states using an algebraic method called "continued fractions" and (2) performing the VA using each entry on the ordered list as their starting state. Again, this method requires the VA to be run many times and as a result, it is too complex for most practical communications applications.

Several decoding schemes for tail-biting convolutional codes have been suggested in issued patents, but none have been widely adopted by industry, which is likely due to their significant computation complexities and memory usage. For example, U.S. Pat. No. 6,256,764 to Atallah describes a process involving: (1) giving the same possibility to all the starting states; (2) performing the Viterbi algorithm once to find an ending state with lowest ending score and making a list including all the ending states within a certain value range to the lowest ending score; (3) performing the Viterbi algorithm with every list state as a starting state and recording the corresponding score; and (4) comparing all the recorded scores of the last step, selecting the lowest one, and saving it as the real ending and starting state. Again, this method requires that the Viterbi algorithm be run many times, which increases its computational complexity.

U.S. Pat. No. 6,877,132 to De et al. describes a decoding method that includes the steps of: (1) modifying the input bit stream by repeating part of the input decoding bits; (2) assuming a probability for each possible initial state of the encoder; (3) decoding each symbol of the input decoding bit stream using majority logic with reference to a trellis structure corresponding to the encoder; and (4) reorganizing the output bit stream according to the rules of used for modifying the input bit stream. This method has a number of disadvantages including the bit stream needing to be modified both before and after decoding and the Viterbi algorithm needing to be performed many times with relatively high complexity. As a result, this method does not provide a useful general decoding algorithm for tail-biting convolutional codes.

U.S. Pat. No. 5,349,589 to Chennakeshu et al. describes another decoding method, but as with the other methods discussed above, this method has not been widely adopted by the communications industry. The decoding method includes: (1) separating an encoded frame of data into key bits, critical bits, and unprotected bits in which the key bits and critical bits in the received stream are encoded with tail-biting convolutional codes and are merged with unprotected bits; (2) splitting the received data into convolutionally encoded bits and unprotected accordingly; and (3) starting from all the possible states, decoding the convolutionally encoded bits into a number of possible paths using a generalized Viterbi algorithm and then finding the path which provides a lowest path metric. This method is not entirely acceptable for implementation in standards-based encoders and decoders because both the encoding and decoding data are special. Hence, this method does not provide a general decoding algorithm useful for tail-biting convolutional codes.

From this discussion, it can be seen that these suggested decoding methods typically perform the VA repeatedly until an end state matches a starting state, with the main difference between the methods being the way the search for the real starting state is performed. The number of VA iterations is generally so high that these methods are undesirably complex for implementation in a real-time software application, such as would be used in a digital signal processor (DSP) of a communication receiver. In bad channel conditions (such as those with a low signal to noise ratio), the trellis or decoding path that has the same starting state and ending state may not even exist, which causes the aforementioned methods to simply not work.

Hence, there remains a need for an improved method, and associated decoders, for decoding data that has been encoded using tail-biting convolutional codes. Preferably, such a decoding method would be designed with lower computational complexity and memory usage when compared with prior decoding schemes, and further, it is preferable that such a decoding method would be well-suited for use in standard communication systems and networks, such as in WiMAX and other wireless receiving devices (e.g., an OFDMA mode device and the like) including those configured according to the IEEE 802.16 standard.

SUMMARY OF THE INVENTION

The present invention addresses the above problems by providing a channel decoding algorithm or method (and decoders configured to run such a decoding method) for decoding tail-biting convolutional codes. The decoding method has relatively low complexity and is useful for decoding in nearly any communication system such as a digital radio communication system and is particularly well suited for decoders provided in OFDMA uplink receivers and other WiMAX receivers. As discussed above, employing a maximum likelihood decoder, known as Viterbi decoder, for tail-biting convolutional codes will cause some problems due to the fact that the decoder is unaware of the encoder's starting state. Most prior encoding and decoding error correction methods use tail-biting over short encoder blocks. Unfortunately, in order to find the encoder starting state, a Viterbi decoder has to be run several times, which makes implementation in an operation communication system difficult. In standard IEEE 802.16d/e system OFDMA mode, tail-biting is adopted as the mandatory channel coding scheme, and as a result, the encoder blocks are not short.

With this in mind, the present invention provides an efficient decoding technique for tail-biting convolutional codes with desired error protection results but with less computational consumption that is particularly well-suited for use with IEEE 802.16d/e and similar communication devices. Briefly, the decoding method of the invention uses a search depth Viterbi decoding method, and only runs a Viterbi algorithm one or two times (i.e., more than once but at most twice) over the received encoded block or input stream. Thus, the decoding method greatly reduces the computational and implementation complexity that will facilitate adoption of WiMAX and other receivers with a decoder providing this decoding method such as in a low-complexity tail-biting convolutional codes decoder suitable for the requirements of mobile radio communication systems like those built to IEEE 802.16d/e.

More particularly, a method is provided for decoding a bit stream or signal that is transmitted over a channel after being encoded by a tail-biting convolutional codes encoder. The method includes initializing a correction depth that defines a number of bits or symbols in the first portion of a received stream or block that will be processed twice for error correction and replaced (i.e., with correct or corrected code). The correction depth or length is an experientially determined value that is selected based on the length of the received block and the channel through which it was transmitted (e.g., from a transmitter to a receiver performing the decoding method). The method continues with selecting a first starting state from a set of encoding states and initializing a metric value for the selected starting state as zero and the other states as infinity. Then, a number equal to the block length of the symbols from the input bit stream are read and a Viterbi algorithm is performed on these symbols from the first starting state to determine path metrics and to identify a minimum-metric path based on the determined path metrics. The ending state for the minimum-metric path is determined and the output associated with this ending state is identified as the "previous output." The method then continues with setting a second starting state equal to the ending state of the minimum-metric path, and second reading a number of the symbols from the previous output, but the number of symbols read are equal to the correction depth. Then the Viterbi algorithm is performed on the second set of read symbols from the second starting state to generate a correct or corrected output. A decoded final output is generated by replacing a number of the symbols equal to the correction depth in the previous output with the correct or corrected output.

To save memory and to decrease the complexity of the decoding process, the Viterbi algorithm may be implemented as a "Search Depth" Viterbi algorithm (SDVA), and the method includes initiating a search depth value (SD) based on the block length (L) and the constrain length (e.g., SD is generally defined as 5 to 7 times or other multiples of the constraint length). In performing the SDVA, the path metrics are calculated for a number of stages equal to the search depth, with the calculating beginning from the starting state and terminating at all possible ending states. Based on this calculating process, the path having the minimum path metric at a stage of SD−1 is identified. The SDVA also includes calculating from a first stage to a stage of L−2 and performing this calculating for a number of iterations equal to L−SD−1. Then, the SDVA continues with providing outputs of the last SD bits according to the minimum path metric. The decoding method is generally suited to decoding tail-biting convolutional codes including those defined by standards such as IEEE 802.16d/e.

DETAILED DESCRIPTION OF THE PREFERRED EMBODIMENTS

The present invention is directed to methods (and components such as decoders implementing such methods and receivers or receiving devices with such decoders) that are designed to provide effective decoding of signals or data streams encoded using tail-biting convolutional codes but yet to require less computational-complexity and memory usage.

Figure 1:
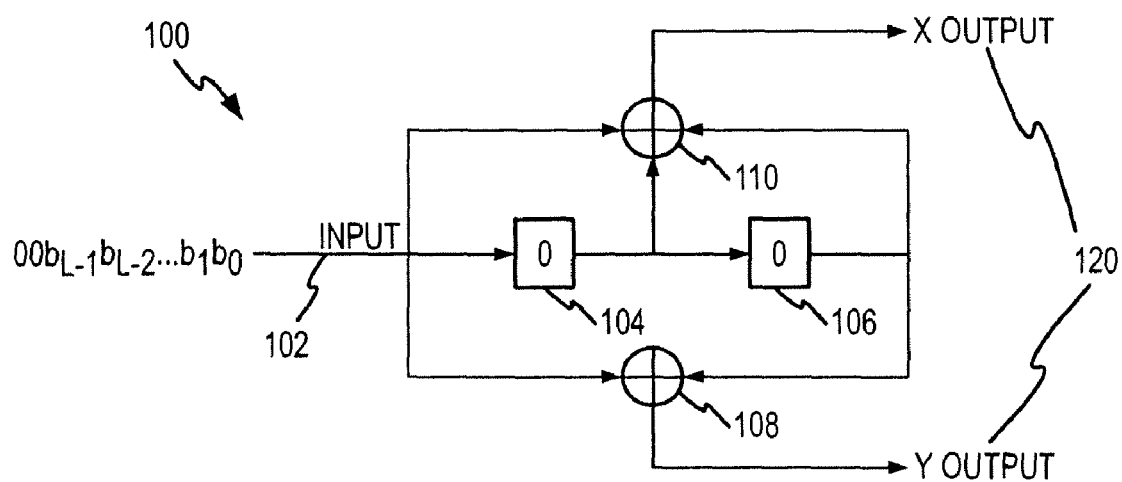
FIG. 1 illustrates an encoder structure for encoding a bit stream using tail bits convolutional codes.
Figure 2:
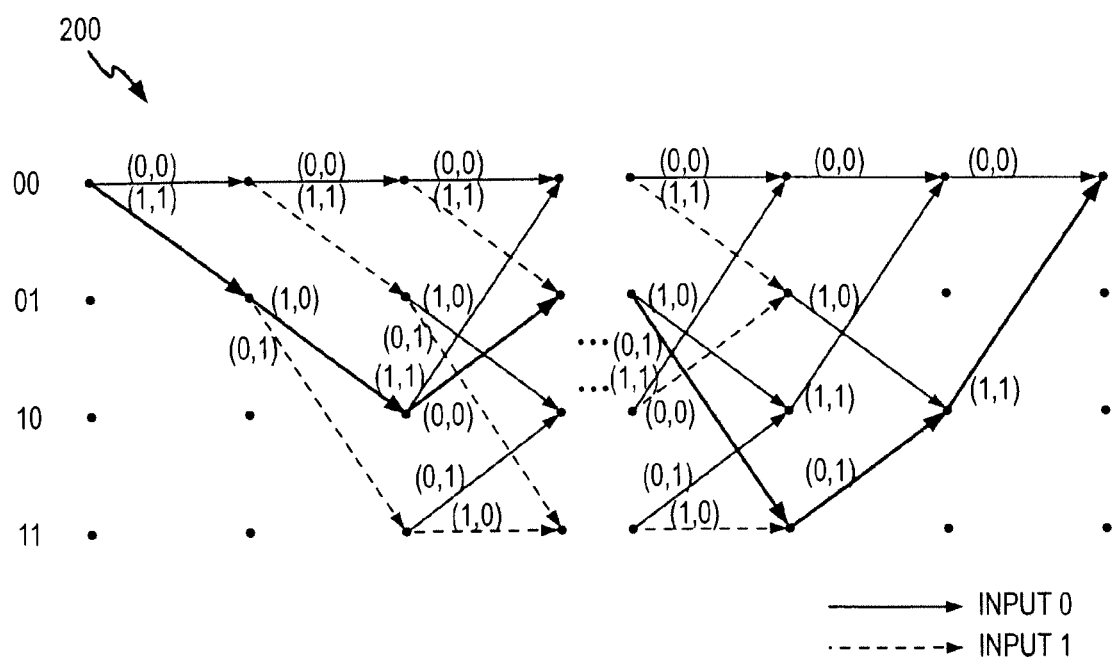
FIG. 2 illustrates a trellis diagram for tail bits convolutional codes.
Figure 3:
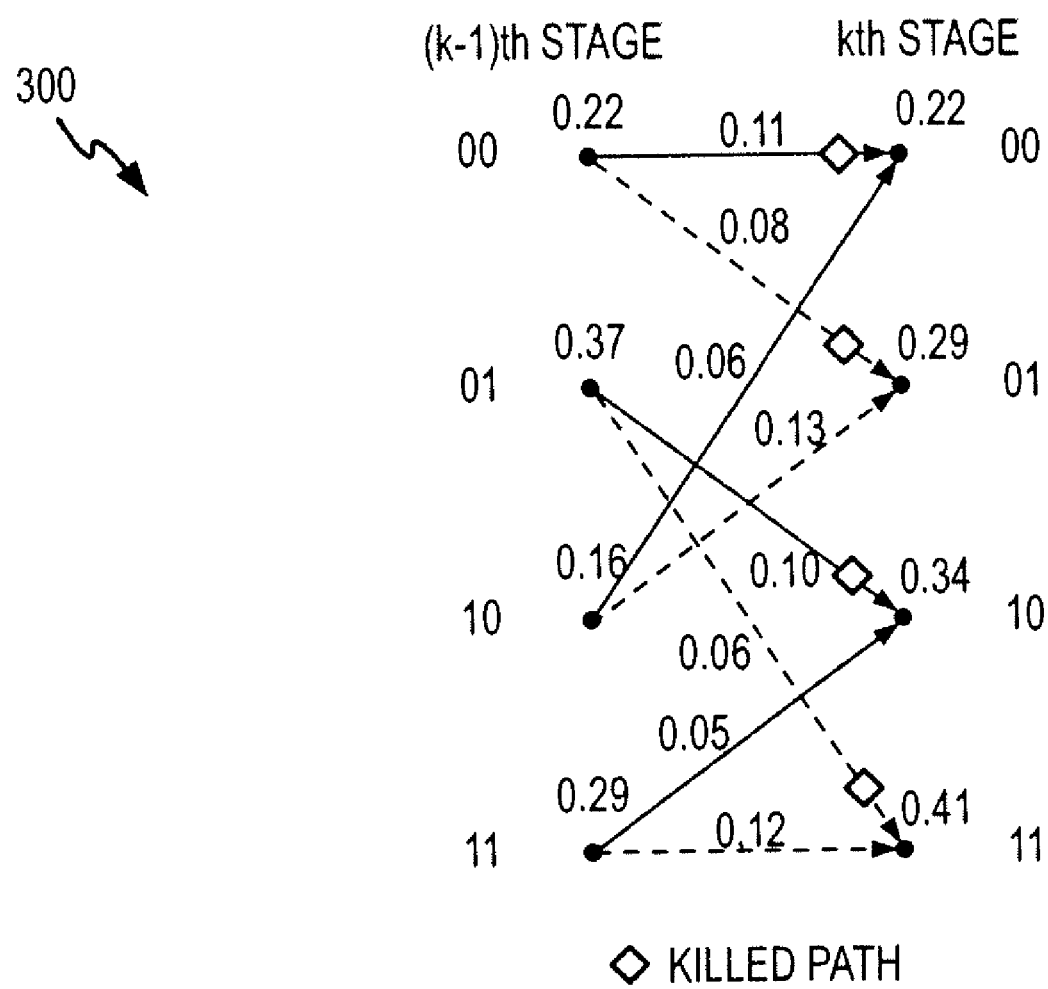
FIG. 3 illustrates an Add-Compare-Select (ACS) process used in a Viterbi algorithm to decode data streams encoded using convolutional codes.
Figure 4:
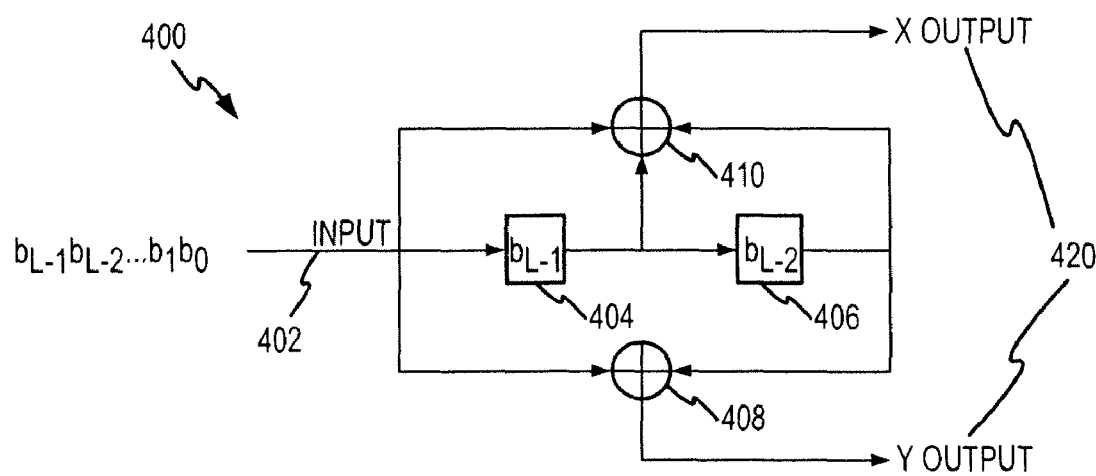
FIG. 4 shows an encoder structure for encoding a bit stream using tail-biting convolutional codes.
Figure 5:
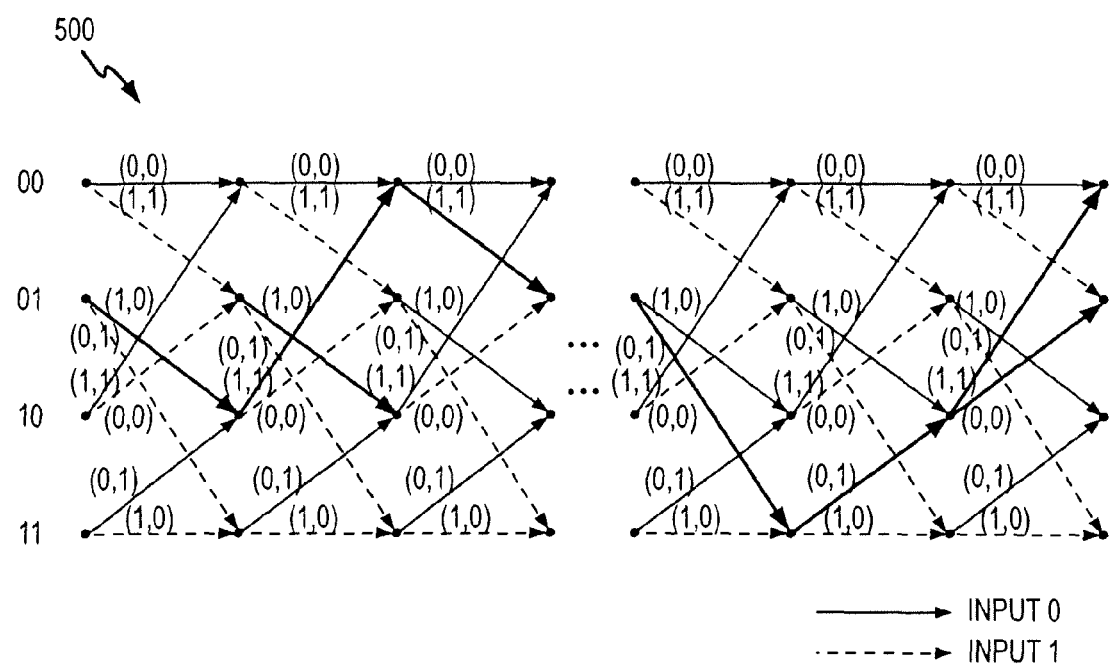
FIG. 5 illustrates a trellis diagram for tail-biting convolutional codes.
Figure 6:
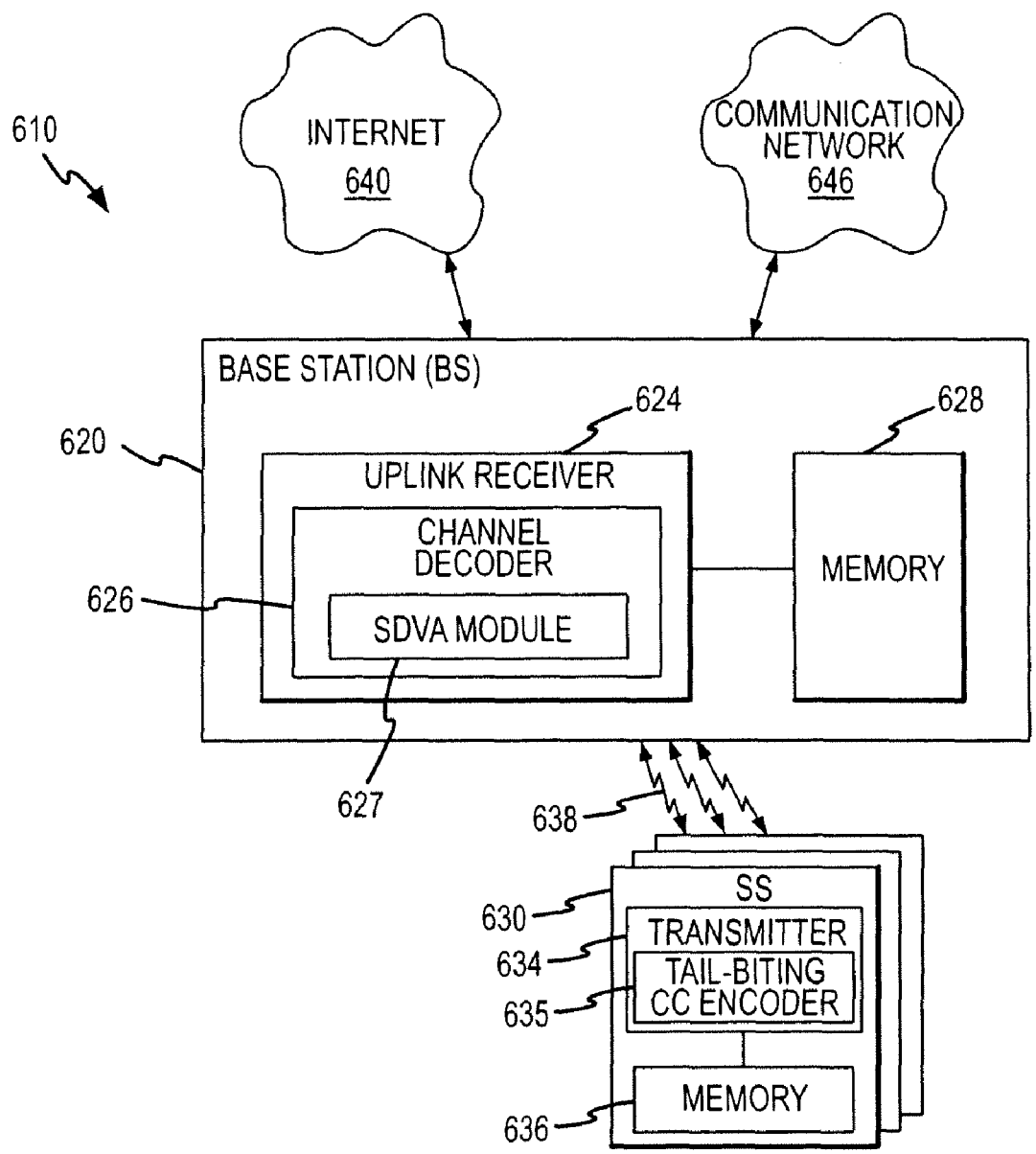
FIG. 6 is a simplified block diagram of a communication system or network according to an embodiment of the invention.

FIG. 6 illustrates a communication system 610 in which the tail-biting convolutional codes decoding techniques of the present invention may be utilized. As shown, the system 610 includes a base station or BS 620 that is in communication with one or more public or private networks, e.g., Internet 640 and communication network 646, and in typical embodiments, the link to networks 640, 646 is a wired or wireless communication link, such as those defined between BSs and networks in IEEE 802.16 or the like (e.g., a WiMAX network-BS link). The BS 620 is also in communication via user or SS signals 638 with SSs 630. The signals 638 are encoded for forward error correction and may be wireless, random access signals or the like as defined by standards such as the WiMAX standard IEEE 802.16. The BS 620 includes an uplink receiver 624 and memory 628 which is accessible by the receiver 624. The uplink receiver 624 functions to decode signals 638 from the SS 630 and to this end, includes a channel decoder 626 that uses a search depth Viterbi algorithm (SDVA) module 627, which may be provided as software and/or hardware components, to provide low-complexity decoding of the bit stream 638 as is discussed in great detail below. The SS includes a transmitter 634 that uses a tail-biting CC encoder 635 (which may be a software module and/or hardware components) to encode the signals 638 including using SS memory 636 (e.g., shift registers or the like useful for encoding as discussed earlier). The system 610 is simplified in part because typical communication devices will implement both a transmitter and a receiver for encoding and decoding the signals or data streams 638 (e.g., the BS 620 would also include a transmitter similar to transmitter 634 and the SS 630 would include a receiver with a channel decoder similar to decoder 626). Hence, the particular configuration of the system 610 is not limiting to the invention, with the system 610 representing in general a representative WiMAX communication system, such as may be established to provide broadband Internet 640 or network access or digital TV access 646 in a wired or wireless manner for a plurality of users and/or SSs 630 via a base station 620.

To practice the invention, the computer, network devices, and communication devices, such as the user/client devices or subscriber stations (SSs) and base stations (BSs), may be any devices useful for providing the described functions, including well-known data processing and communication devices and systems such as wireless and cellular phones and similar devices; computer systems; personal digital assistants; personal, laptop, and notebook computers; mobile computing and/or communication devices with processing, memory, and input/output components; and server devices configured to maintain and then transmit digital data. Data typically is communicated in digital format following standard wired and wireless communication and transfer protocols, such as TCP/IP, HTTP, and the like, or IP or non-IP wireless communication protocols such as TCP/IP, TL/PDC-P, WSP, Bluetooth, TREE 802.11b, 802.16 (WiMAX), and/or other IEEE standards, and/or other protocols or formats yet to be developed or evolved, but this is not intended as a limitation of the invention. Typical embodiments are configured to support forward error correction in communication systems implementing the OFDMA mode of IEEE 802.16 and its encoding procedures but the teachings of the invention may be implemented in other communication systems such as radio communication systems utilizing short block signals.

The following discussion provides a detailed explanation of the SDVA decoding method of the invention and how it may be beneficially implemented within communication systems. Compared with the traditional tail bits convolutional codes, the shift registers of tail-biting encoders, such as encoder 635, are initialized by the last data bits of the data block being encoded. Therefore, the starting state and ending state of a trellis diagram for a tail-biting decoder, such as decoder 626, are data-dependent and unknown before the decoding procedure is begun, and additionally, the starting state will equal to ending state. To obtain enhanced performances of a tail-biting CC decoder, the inventors initially experimented with a complex decoding algorithm based on a conventional VA. In such a decoding method or algorithm, one state is randomly chosen as a starting state, a VA is performed to accumulate the paths metrics to all possible ending states, and the minimum-metric path is identified. This algorithm is iterated until all possible starting states are taken. After many simulations, some interesting phenomena were found by the inventors to occur. Specifically, when a decoded block size is bigger than 100 bits and $E_b/N_o$ (i.e., the signal-to-noise-ratio) is over a certain threshold value (e.g., approximately 1 to 3 decibels according to different channels conditions), the paths from all tentative starting states tend to terminate on one specific state. If this specific ending state derived from the last VA iteration is set as the starting state for the next VA iteration, the decision errors between the two successive iterations are different only in some of the beginning bits. Based on this and other information and conclusions, the inventors determined their decoding method.

The proposed decoding method performs a VA one to two times (i.e., more than once but no more than twice). A state is randomly chosen as a tentative starting state, and the VA is performed from this tentative starting state to accumulate path metrics. The minimum-metric path and its corresponding ending state are identified, and then, the output according to the ending state is called a previous output. This ending state is taken as the tentative starting state for the next VA iteration. The VA is performed again from this specified starting state but only over some symbols (i.e., a subset of the bit stream being decoded) to give a correct or corrected output. Then, the correct output is used to replace the corresponding previous output bits to get the final output. An embodiment of a decoding process 700 of the invention is shown generally as described in FIG. 7 in which the previous output 710 is processed firstly to get the previous output and the starting state for correct output 720. With the starting state and the pre-identified correction depth, correct output is processed to get the correct output. At last, the final output 730 is found by replacing the corresponding place in previous output with the correct output. Clearly, the stage at which the second VA iteration stops is an important parameter of the decoding process 700. This iteration stop location is denoted as "Correction Depth" in FIG. 7 or CD. The CD is typically an experiential value that is selected depending on decoded block size of the input bit stream (or previous output) and also on the channel environment.

Since a conventional VA has to trace back from the ending state to the starting state along the trellis to give out the outputs, it is difficult to produce some partial outputs needed for correct output. Moreover, a larger decoded block size results in an increasing of memory usage. To address these problems, the new algorithm or decoding method of the invention preferably uses a "Search Depth Viterbi Algorithm" or SDVA instead of a conventional VA. The Search Depth Viterbi Algorithm is another applying style of a VA but that is different from the general traceback style. Major advantages of the SDVA are that its memory usage has no relation with decoding block size, and the SDVA gives out the outputs as part of the decoding procedure.

Figure 8:
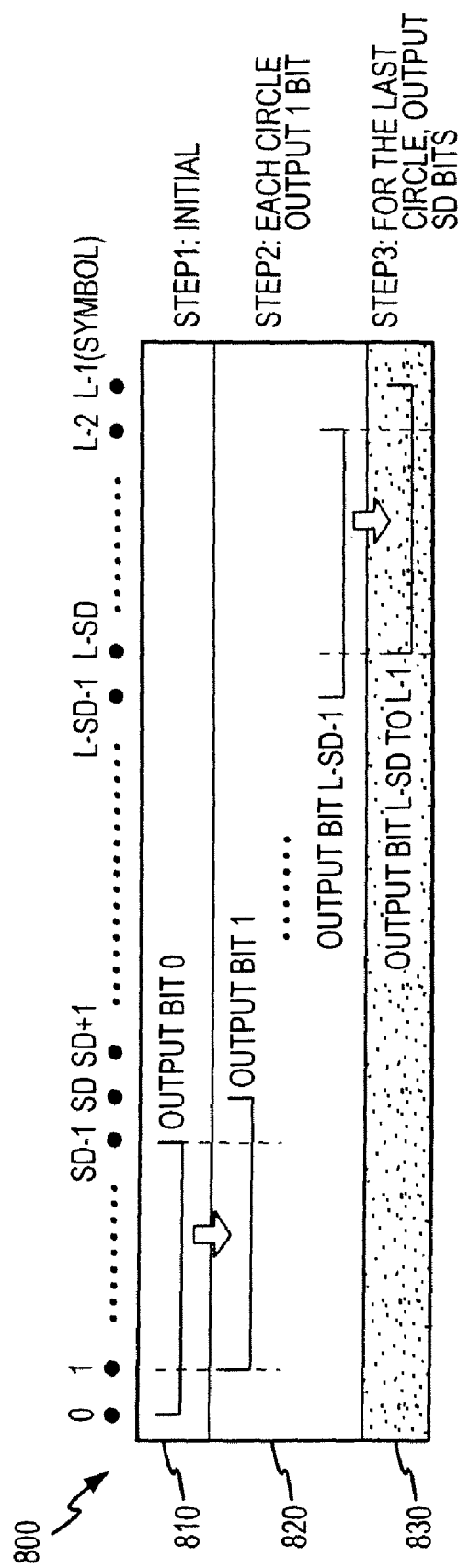
FIG. 8 illustrates a Search Depth Viterbi Algorithm (SDVA) process useful for decoding according to the invention.

A simple SDVA diagram 800 is shown in FIG. 8. As shown, the SDVA process 800 can be divided into 3 steps shown at 810, 820, and 830. The first step 810 is an initial step during which all the path metrics of the first search depth (SD) stages are calculated. The calculations begin from the selected beginning state and terminate at all the possible ending states. Then, the path with the minimum path metric at the stage SD−1 is selected, and the corresponding first output bit 0 is given. The second step 820 is the calculation step. This step involves calculating from the 1st stage to (L−2)th stage and includes (L−SD−1) iterations, where "L" is the block size or length of the input bit stream. The first iteration will be presented as an example. After finishing the first step 810, all the path metrics at the stage 0 are discarded and those of stage SD are added. The new survival path is selected, and the output bit 1 is given according to the path metric on stage SD. The same process is employed to the other iterations in this step 820. The third step 830 of the SDVA process 800 is the final output step. In this step 830, the last iteration is calculated according to the minimum path metric to give the outputs of the last SD bits. In contrast to a general VA, the SDVA 800 can stop at any iteration so as to give a part or subset of the output bits.

Figure 9:
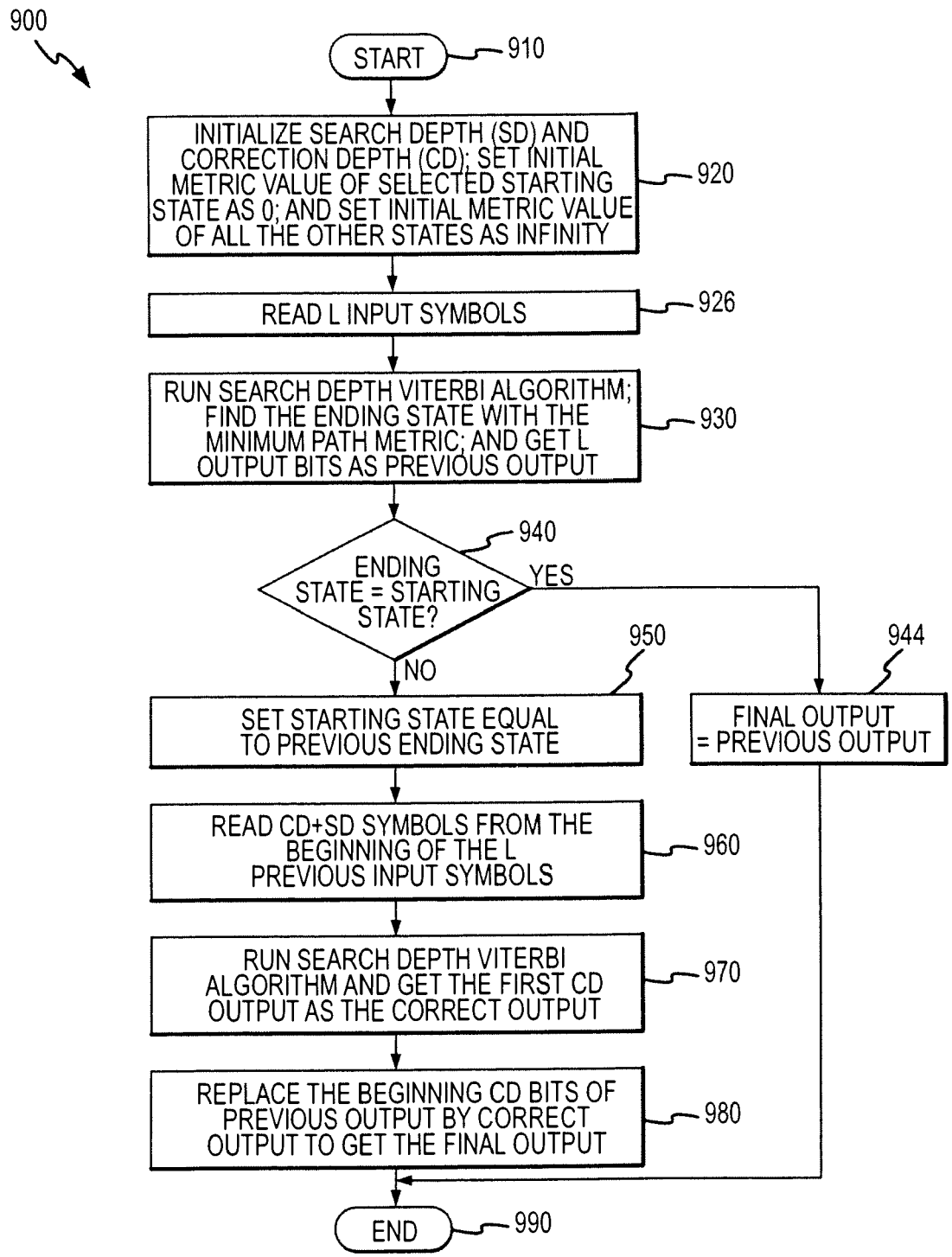
FIG. 9 is a flow chart of a representative decoding method of the invention, such as may be provided by the decoders of FIGS. 6 and 14 and decoding module in FIG. 11.

FIG. 9 illustrates an SDVA decoding method 900 that is useful for decoding bit streams that were encoded using a tail-biting convolution codes encoder. This method may be provided by running a decoder or decoding module configured according to the present invention. The method 900 starts at 910 such as by providing an SDVA decoding module in a receiver DSP or the like. At 920, the method 900 includes initializing the search depth (SD) and the correction depth (CD) values according to the block size L and the transmit channel environment in which the transmitter and receiver (or other device running a decoder function to provide the method 900) are operating. Step 920 also includes setting the initial metric value of the selected initial starting state to 0 and all the others to infinity. At 926, the method 900 continues with reading the intended L input decoding symbols (i.e., the received, encoded input bit stream from a transmitter running a tail-biting CC encoder).

The decoding method 900 continues at 930 with running the Search Depth Viterbi Algorithm SDVA) for the first time on the L read symbols from the input stream. This step includes finding and marking the state with the minimum path metric as the ending state. At 930, the method 900 also includes producing L output bits according to it as the previous output. At 940, the decoding method 900 includes checking whether the ending state equals the selected initial starting state. If yes, at 944, the method 900 includes taking the previous output as the final output, otherwise go to step 950 where the starting state is set equal to the previous ending state. At 960, the CD and SD input symbols are reread from the beginning of the L input symbols, and at 970 the SDVA is run or launched for the second time. In step 970, the first CD bits are retrieved as the correct output. At 980, the decoding method 900 continues with replacing the beginning CD bits of the previous output with the correct output from step 970 to get a final output (i.e., the decoded bit stream). The method 900 ends at 990 (or returns to 920 or 926 for processing a next input bit stream).

Figure 10:
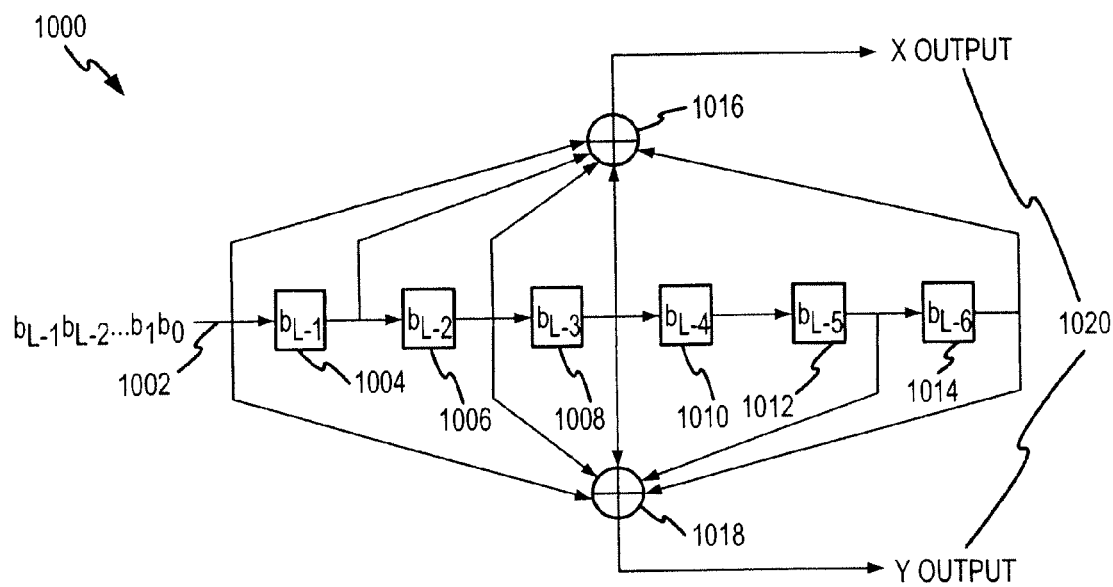
FIG. 10 illustrates an encoder structure to provide tail-biting convolutional codes encoding.

FIG. 10 illustrates an encoder 1000 configured to provide tail-biting CC encoding which is adopted as a mandatory FEC scheme in OFDMA mode of WEE 802.16d/e system as discussed above. As shown, the encoder 1000 receives an input bit stream 1002 having a block length L, a set of memory elements or shift registers 1004, 1006, 1008, 1010, 1012, and 1014, a pair of adder circuits 1016, 1018, and outputs 2 bits 1020 for each input bit from stream 1002. The tail-biting Convolutional Codes encoder 1000 is the encoder used in the WEE 802.16d/e standard (but, of course, other tail-biting CC encoder configurations can be used to practice the invention with the decoding method being useful for this particular encoder as well as other tail-biting CC encoder arrangements). For the encoder 1000, the coding rate is 1/2, the constraint length is 7, and the generator polynomials are as shown below:

$$G_1 = 171_{OCT} \text{ FOR X}$$

$$G_2 = 133_{OCT} \text{ FOR Y}$$

The encoder 1000 is initialized with the last six input bits of the input bit stream before encoding.

Figure 11:
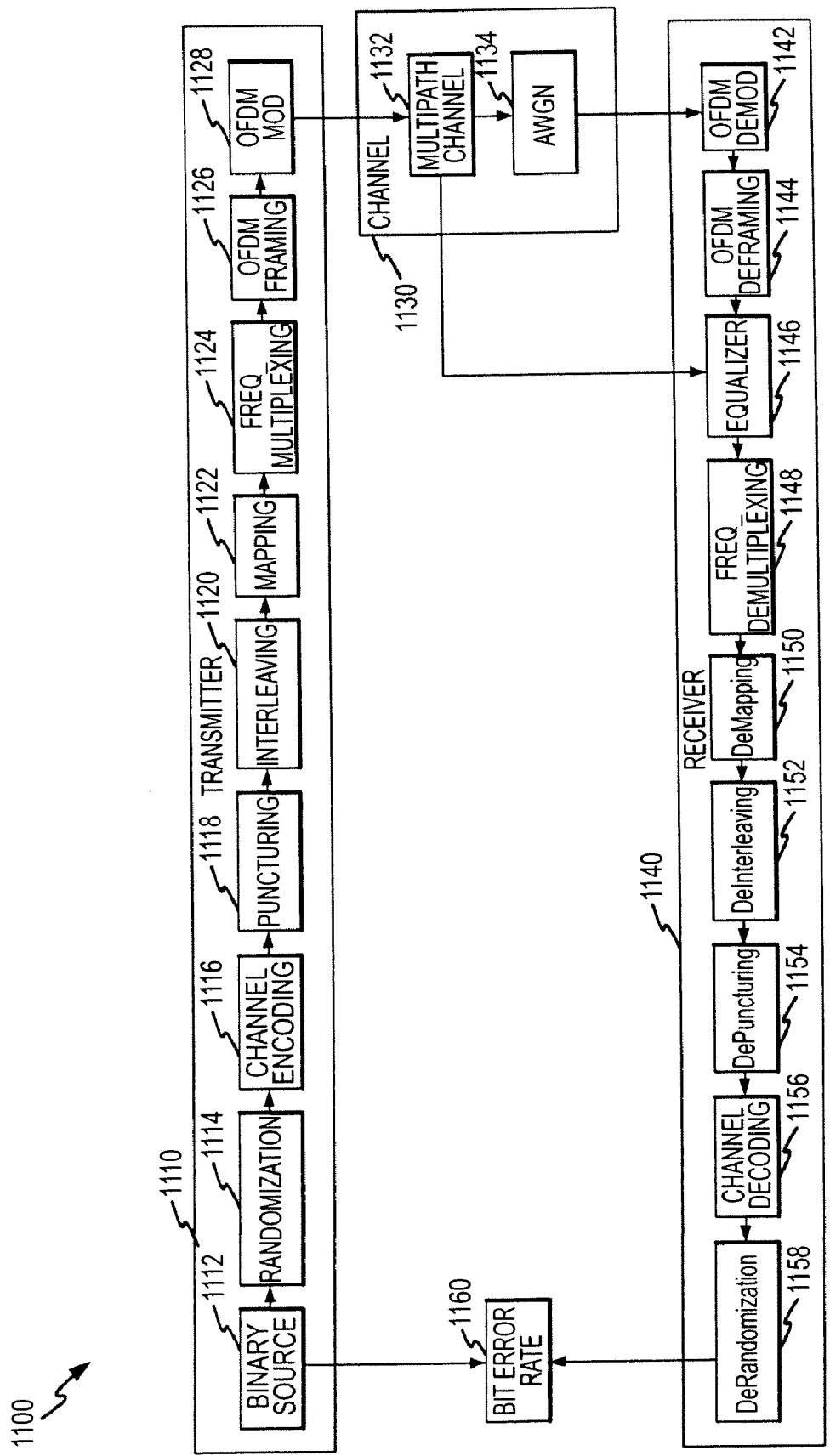
FIG. 11 illustrates a test system used for simulating encoding and decoding in a communication system having a channel that potentially introduces errors in data transmissions.

To verify the proposed decoding algorithm's performance in a practical system, the inventors compared a tail-biting CC decoder configured according the present invention (e.g., to run the decoding method 900 of FIG. 9) with that of a tail bits CC decoder as defined in IEEE 802.16d/e for an OFDMA system. The simulation system 1100 shown in FIG. 11 had three major parts: a transmitter 1110, a channel 1130 with a multipath channel 1132 and an AWGN 1134, and a receiver 1140 that produce a bit error rate 1160.

At the transmitter side 1110, a binary source generator 1112 randomly produces the bit stream for the simulation chain, and these bits are randomized in module 1114. The transmitter 1110 includes an encoder 1116 that is configured either for tail-bits convolutional codes encoding or for tail-biting convolutional codes encoding depending on which simulation is being performed. After encoding, the encoded data is punctured by module 1118 to match the required coding rates (in Table 1). The punctured data is interleaved by module 1120 and then mapped, frequency multiplexed, and OFDM framed (e.g., for modulation by OPSK, 16-ZAM, or 64QAM and further interleaving) by modules 1122, 1124, and 1126 before the complex-valued data is fed into an OFDM modulator 1128 and transmitted to channel 1130.

TABLE 1

| Convolutional Codes with puncturing configuration | | | |
| --- | --- | --- | --- |
| Code Rate | 1/2 | 2/3 | 3/4 |
| X | 1 | 10 | 101 |
| Y | 1 | 11 | 110 |
| XY | $X_1Y_1$ | $X_1Y_1Y_2$ | $X_1Y_1Y_2X_3$ |

At the channel 1130, an AWGN channel module 1134 and a multi-path channel module 1132 (SUI serial) are concatenated. At the receiver side, on the assumption of perfect channel estimation and synchronization, the receiver 1140 performs the exact inverse operations as the transmitter and includes an OFDM demodulator 1142, an OFDM deframing module 1144, an equalizer 1146 linked to the multipath channel 1132, a frequency demultiplexing module 1148, a demapping module 1150, a deinterleaving module 1152, a depuncturing module 1154, a channel decoding module 1156 adapted to provide the SDVA decoding described herein, and a derandomization module 1158. It should be noted that the system 1100 was used for simulation purposes, and it is likely that an implementation in a real-world communications system will differ to practice the invention, i.e., the receiver 1140 may not include the same modules shown except that typical implementations would include a decoding module 1156 configured to provide the SDVA decoding algorithm of the invention (e.g., see the decoding process 900 of FIG. 9).

Figure 12:
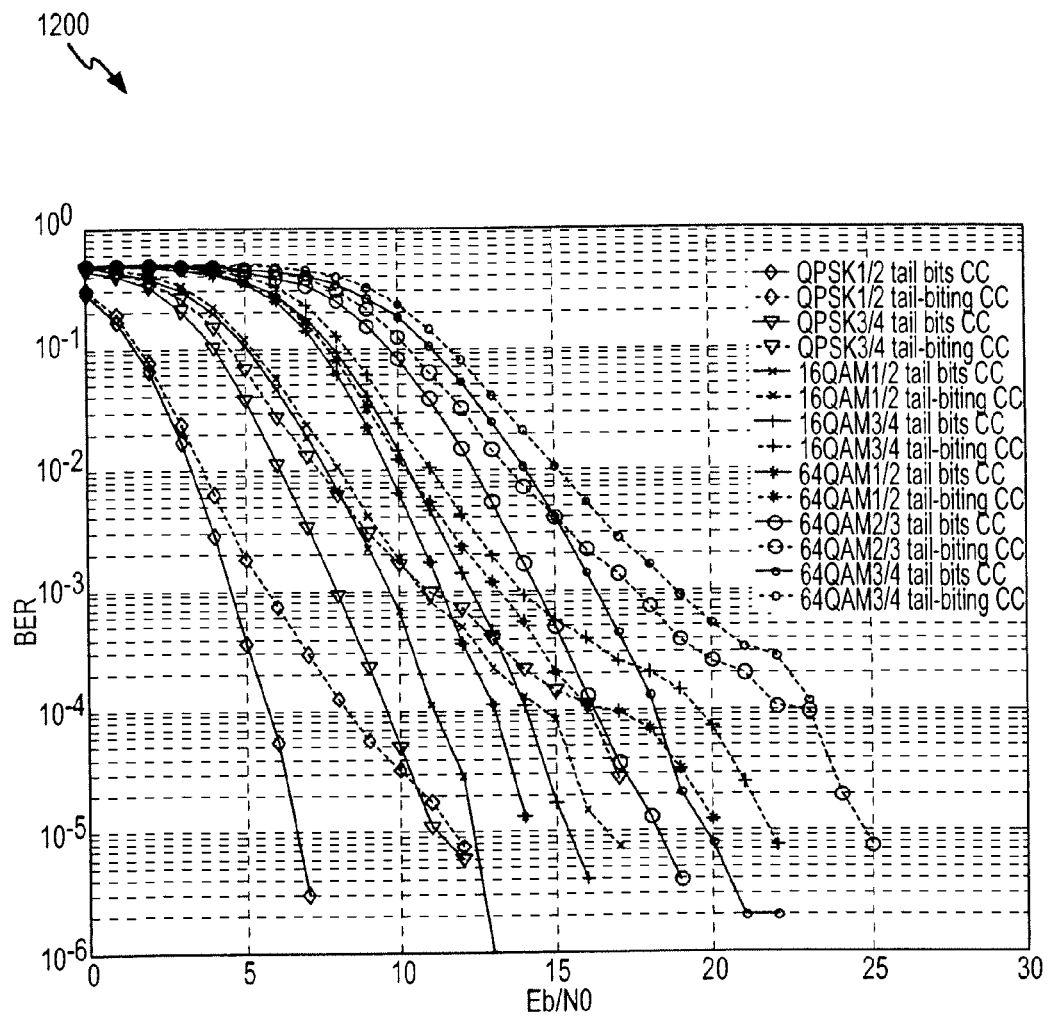
FIG. 12 is a graph of a BER performance comparison based on operation of the system of FIG. 11 of tail bits and tail-biting convolutional codes under SUI-4 Channel in which the decoding method of the invention was used for decoding data streams that were encoded using the tail-biting convolution codes.
Figure 13:
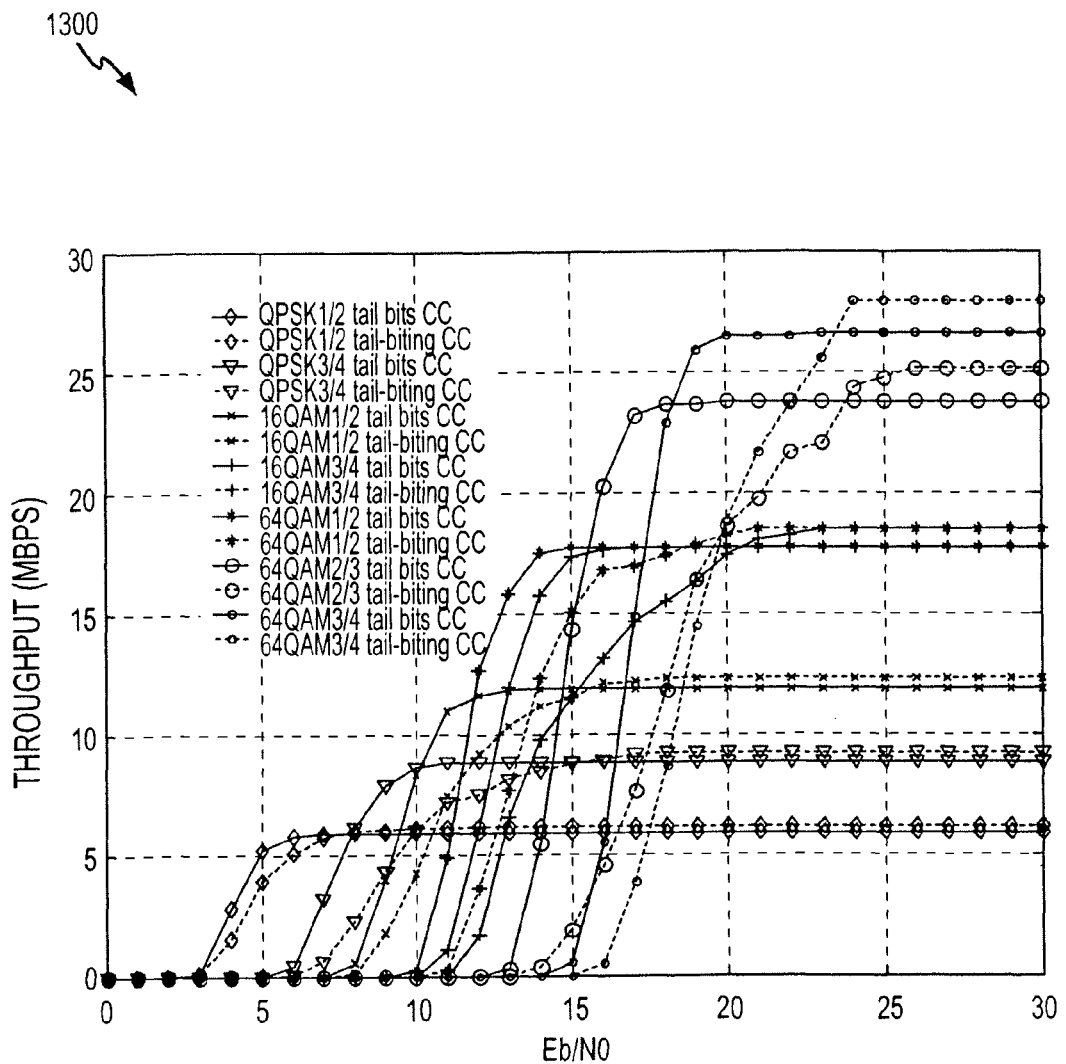
FIG. 13 is a graph of a throughput comparison of tail bits and tail-biting convolutional codes under SUI-4 Channel during operation of the simulation system of FIG. 11.

The simulation results from operation of the system 1100 are shown in FIGS. 12 and 13. FIG. 12 provides a graph 1200 of the BER performance of the system 1100 using tail bits convolutional codes and tail-biting convolutional codes under different modulation and coding schemes over SUI-4 channel. In this simulation, the shortest required block sizes were used. Tail-bits convolutional codes have over 5 dB gains against tail-biting convolutional codes when BER is below $10^{-4}$. It can be expected that tail-biting convolutional codes become better along with increases in the block size. FIG. 13 provides a graph 1300 of the throughput performance of the system using tail bits convolutional codes and tail-biting convolutional codes under different modulation and coding schemes over SUI-4 channel. The graph 1300 shows that tail-biting convolutional codes have greater throughput than tail-bits convolutional codes when $E_b/N_o$ is high.

Figure 7:
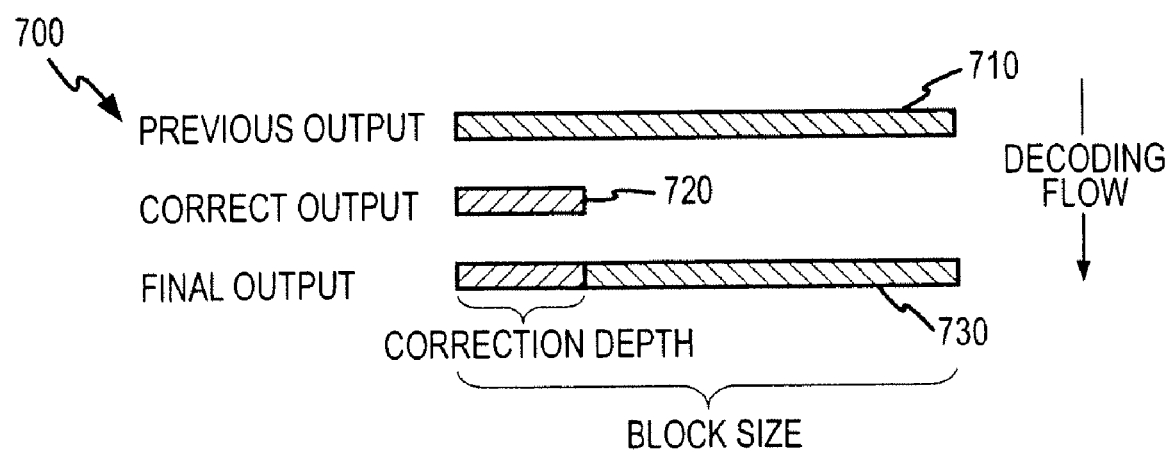
FIG. 7 is a simplified process flow or structure for a proposed decoding method of the present invention.
Figure 14:
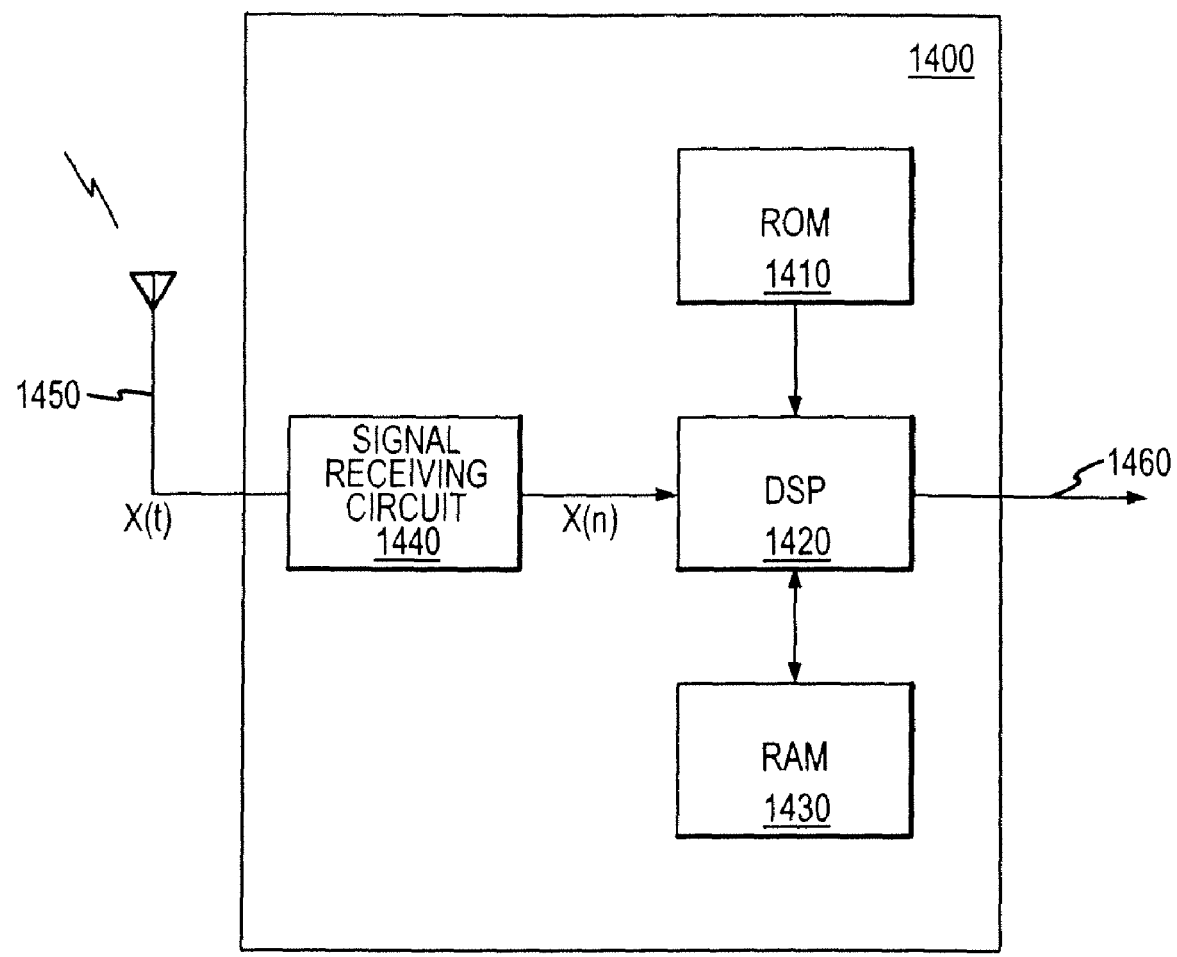
FIG. 14 is a block diagram of a radio or wireless signal receiving system in which embodiments of the decoding method of the present invention, such as depicted in FIG. 9, may be implemented.

FIG. 14 illustrates a block diagram of a receiver or receiving system 1400 that may be configured to provide the SDVA decoding described herein (such as with reference to FIG. 9). As shown, the receiving system 1400 includes memory in the form of read-only memory (ROM) 1410 and random-access memory (RAM) 1430. A digital signal processor (DSP) 1420 is provided for running software modules such as a tail-biting CC decoding module that utilizes the SDVA algorithm or method. A signal receiving circuit 1440 is also included in the system 1400 and is coupled to an antenna 1450 for receiving signals, X(t), e.g., analog radio or wireless signals. The signals, X(t), are converted into digital signals (or input bit streams, frames, or blocks), X(n), by the signal receiving circuit 1440 that are then passed to the DSP 1420 for decoding (as discussed throughout this description). In a preferred embodiment, the digital signals that are received by the system 1400 have been encoded based on tail-biting convolutional codes (such as those defined by IEEE 802.16d/e or the like). The ROM 1410 in some embodiments stores software or applications that are utilized for controlling the operation of the DSP 1420 such as for decoding tail-biting convolutional codes using the SDVA algorithm of the invention. RAM 1430 may be used to buffer output frames or other information used during the decoding by the decoding (and other receiver) software. The DSP 1420 operates to decode the input bit stream, X(n), and provides a final output 1460, e.g., with a final output 730 that includes a correct or corrected output 720 as shown in FIG. 7).

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A method for decoding a bit stream encoded by a tail-biting convolutional codes encoder, comprising:
   initializing a correction depth defining a number of bits;
   selecting a first starting state from a set of encoding states and initializing a metric value for the first starting state to a value indicating high likelihood and metric values for other ones of the encoding states to a value indicating low likelihood;
   first reading symbols from an input bit stream that is encoded using tail-biting convolutional codes and having a particular block length, the number of symbols read being equal to the block length;

performing a Viterbi algorithm on the first read symbols from the first starting state to determine path metrics and identify the highest likelihood path based on the determined path metrics, wherein an ending state for the highest likelihood path is identified and output associated with the ending state of the highest likelihood path is identified as previous output;

setting a second starting state equal to the ending state of the identified highest likelihood path;

second reading a number of symbols from a beginning of the previous output, wherein the number is equal to the correction depth;

performing the Viterbi algorithm on the second read symbols from the second starting state to generate a correct output; and generating a decoded final output by replacing a number of the symbols in the previous output equal to the correction depth with the correct output.

2. The method of claim 1, wherein the highest likelihood path is determined based on the minimum metric.

3. The method of claim 1, wherein the value indicating the highest likelihood is a low value.

4. The method of claim 3, wherein the low value is zero.

5. The method of claim 1, wherein the value indicating low likelihood is a high value.

6. The method of claim 5, wherein the high value is the highest value possible.

7. The method of claim 1, wherein the correction depth is selected based on the block length and a channel over which the input bit stream was transmitted.

8. The method of claim 1, wherein the Viterbi algorithm comprises a search depth Viterbi algorithm (SDVA) and the method further comprises initializing a value for the search depth (SD).

9. The method of claim 8, wherein the SDVA comprises calculating path metrics of a number of stages equal to the SD with the calculating beginning from the starting state and terminating at all possible ending states and wherein the SDVA further comprises identifying a path having the highest likelihood path metric at a stage of SD-1.

10. The method of claim 9, wherein the SDVA further comprises calculating from a first stage to a stage of block length minus two and performing the calculating for a number of iterations equal to the block length minus the SD minus one.

11. The method of claim 10, wherein the SDVA further comprises providing outputs of the last SD bits according to the minimum path metric.

12. The method of claim 1, wherein the input bit stream is encoded by an encoder having a coding rate of 1/2 and a constraint length of 7, whereby the method is adopted for decoding using parameters for tail-biting convolutional codes used for orthogonal frequency division multiplexing access (OFDMA) mode of IEEE 802.16d/e systems.

13. A method for decoding a bit stream encoded by a tail-biting convolutional codes encoder, comprising:

initializing a correction depth defining a number of bits;

selecting a first starting state from a set of encoding states and initializing a metric value for the first starting state to a value indicating high likelihood and metric values for other ones of the encoding states to a value indicating low likelihood;

first reading symbols from an input bit stream that is encoded using tail-biting convolutional codes and having a particular block length, the number of symbols read being equal to the block length;

performing a Viterbi algorithm on the first read symbols from the first starting state to determine path metrics and identify a maximum-metric path based on the determined path metrics, wherein an ending state for the maximum-metric path is identified and output associated with the ending state of the maximum-metric path is identified as previous output;

setting a second starting state equal to the ending state of the maximum-metric path;

second reading a number of symbols from a beginning of the previous output, wherein the number is equal to the correction depth;

performing the Viterbi algorithm on the second read symbols from the second starting state to generate a correct output; and generating a decoded final output by replacing a number of the symbols in the previous output equal to the correction depth with the correct output.

14. The method of claim 13, wherein the value indicating the highest likelihood is a low value.

15. The method of claim 13, wherein the value indicating low likelihood is a high value.

16. The method of claim 13, wherein the correction depth is selected based on the block length and a channel over which the input bit stream was transmitted.

17. The method of claim 13, wherein the Viterbi algorithm comprises a search depth Viterbi algorithm (SDVA) and the method further comprises initializing a value for the search depth (SD).

18. A method for decoding a bit stream encoded by a tail-biting convolutional codes encoder, comprising:

initializing a correction depth defining a number of bits;

selecting a first starting state from a set of encoding states and initializing a metric value for the first starting state to zero and metric values for other ones of the encoding states to a highest value;

first reading symbols from an input bit stream that is encoded using tail-biting convolutional codes and having a particular block length, the number of symbols read being equal to the block length;

performing a Viterbi algorithm on the first read symbols from the first starting state to determine path metrics and identify a maximum-metric path based on the determined path metrics, wherein an ending state for the maximum-metric path is identified and output associated with the ending state of the maximum-metric path is identified as previous output;

setting a second starting state equal to the ending state of the maximum- metric path;

second reading a number of symbols from a beginning of the previous output, wherein the number is equal to the correction depth;

performing the Viterbi algorithm on the second read symbols from the second starting state to generate a correct output; and generating a decoded final output by replacing a number of the symbols in the previous output equal to the correction depth with the correct output.

19. The method of claim 18, wherein the correction depth is selected based on the block length and a channel over which the input bit stream was transmitted.

20. The method of claim 18, wherein the Viterbi algorithm comprises a search depth Viterbi algorithm (SDVA) and the method further comprises initializing a value for the search depth (SD).

* * * * *